US008988156B2

(12) United States Patent
Vaishnav

(10) Patent No.: US 8,988,156 B2
(45) Date of Patent: Mar. 24, 2015

(54) LOW EMI WIDE FREQUENCY RANGE OSCILLATOR WITH AUTOMATIC DIGITAL AMPLITUDE CONTROL

(71) Applicant: Microchip Technology Incorporated, Chandler, AZ (US)

(72) Inventor: Rohit Vaishnav, Bangalore (IN)

(73) Assignee: Microchip Technology Incorporated, Chandler, AZ (US)

( * ) Notice: Subject to any disclaimer, the term of this patent is extended or adjusted under 35 U.S.C. 154(b) by 23 days.

(21) Appl. No.: 13/893,413

(22) Filed: May 14, 2013

(65) Prior Publication Data

US 2014/0266487 A1 Sep. 18, 2014

(51) Int. Cl.
*H03L 5/00* (2006.01)
*H03G 3/20* (2006.01)
*H03K 5/08* (2006.01)
*H03K 5/1532* (2006.01)

(52) U.S. Cl.
CPC .. *H03L 5/00* (2013.01); *H03G 3/20* (2013.01); *H03K 5/082* (2013.01); *H03K 5/1532* (2013.01)
USPC .......................................... 331/109; 331/183

(58) Field of Classification Search
USPC ................................................ 331/183, 109
See application file for complete search history.

(56) References Cited

U.S. PATENT DOCUMENTS

| 6,462,621 | B1 | 10/2002 | Charles et al. ................. 330/282 |
| 6,847,904 | B2 | 1/2005 | Blake et al. ...................... 702/57 |
| 7,324,561 | B1 | 1/2008 | Miller et al. .................... 370/516 |
| 2008/0180185 | A1* | 7/2008 | Fan et al. ................... 331/117 R |

FOREIGN PATENT DOCUMENTS

JP 2011082744 A 4/2011 ............... H03B 5/08

OTHER PUBLICATIONS

Hou, An Sang et al., "The New Design of AGC Circuit for the Sinusoidal Oscillator with Wide Oscillation Frequency Range," IEEE Transactions on Instrumentation and Measurement, vol. 53, No. 5, 6 pages, Oct. 1, 2004.
Berny, Axel D. et al., "A 1.8-GHz *LC* VCO with 1.3-GHz Tuning Range and Digital Amplitude Calibration," IEEE Journal of Solid-State Circuits, vol. 40, No. 4, 9 pages, Apr. 1, 2005.
Chen, Wu-Hsin et al., "Self-Healing Phase-Locked Loops in Deep-Scaled CMOS Technologies," IEEE Design and Test of Computers, vol. 27, No. 6, 8 pages, Nov. 1, 2010.
International Search Report and Written Opinion, Application No. PCT/US2014/020409, 17 pages, Jun. 4, 2014.

* cited by examiner

*Primary Examiner* — Joseph Chang
(74) *Attorney, Agent, or Firm* — King & Spalding L.L.P.

(57) ABSTRACT

An oscillator/amplifier has a gain controlled amplifier that maintains a desired oscillation waveform amplitude for all possible oscillation frequencies of operation. A peak detector produces a direct current (DC) voltage proportional to the oscillation waveform, and a voltage reference generator provides a reference voltage that is compared against the DC voltage from the peak detector. When the DC voltage is less than the reference voltage the gain of the amplifier is increased, and when the DC voltage is equal to or greater than the reference voltage the gain of the amplifier is decreased. A programmable voltage reference generator may also be used to provide for selection of different oscillation waveform amplitudes. A digital control loop controls the oscillation waveform amplitude over the entire possible frequency range of operation. Various frequency determining elements, e.g., crystal, piezoelectric resonator, inductor-capacitor tuned circuit, resistor-capacitor network, etc., may be used in combination with the oscillator/amplifier.

23 Claims, 3 Drawing Sheets

LOW EMI WIDE FREQUENCY RANGE OSCILLATOR WITH AUTOMATIC DIGITAL AMPLITUDE CONTROL

CROSS-REFERENCE TO RELATED APPLICATIONS

This application claims priority from Indian Patent Application No. 761/DEL/2013 filed Mar. 15, 2013, which is hereby incorporated by reference in its entirety as if fully set forth herein.

TECHNICAL FIELD

The present disclosure relates to oscillator circuits used in integrated circuit devices, and, in particular, for a low electromagnetic interference (EMI) wide frequency range oscillator with automatic digital amplitude control.

BACKGROUND

Clock oscillators for digital devices have to work over a wide range of frequencies depending upon the application in which the digital device is being used. An oscillator is an amplifier whose output is fed back in phase to its input, causing the amplifier to oscillate. If a frequency determining element, e.g., crystal, piezoelectric resonator, inductor-capacitor tuned circuit, resistor-capacitor network, etc., is in the feedback circuit of the amplifier, the amplifier oscillation frequency will be determined by this frequency determining element. The frequency stability of the oscillator will also be determined by the frequency stability of the frequency determining element.

A problem exists however in that one oscillator/amplifier circuit design does not have the same operating characteristics over a wide range of frequencies. It is not commercially feasible to design a specific oscillator/amplifier circuit for each possible frequency of operation of the digital device. Therefore, a worst case design is generally implemented for the highest anticipated frequency of use. This design philosophy, however, creates problems at the lower frequencies of operation since the oscillator/amplifier has more gain at lower frequencies. So much more gain that at the lower operating frequencies the amplitude of the oscillation waveform may be greater than the power supply voltage rails, e.g., $V_{DD}$ and/or $V_{SS}$. This excess oscillation amplitude beyond the power supply voltage rails causes saturation of the output circuits of the amplifier resulting in clipping (limiting) and waveform distortion of the oscillator/amplifier output signal. When the amplitude is greater than $V_{DD}$ and/or less than $V_{SS}$, electrostatic discharge (ESD) protection circuits may be triggered causing unwanted substrate currents and hence noise. Harmonics having significant amplitudes are thereby generated which may cause higher electromagnetic interference (EMI) that may be radiated and/or conducted from the oscillator/amplifier. In addition, excessive oscillator output amplitude may cause increased heating of sensitive frequency determining circuits such as, for example but not limited to, a crystal or piezoelectric resonator. This increased heat dissipation in the frequency determining element may shorten the reliability and useful operating life thereof.

SUMMARY

Therefore a need exists for an oscillator/amplifier that is usable over a wide range of operating frequencies, does not have excessive output amplitude, nor cause output signal distortion creating EMI problems, and frequency determining element stress due to heating thereof at the lower frequencies where excess amplification is inherent in the circuit design of the oscillator/amplifier.

According to an embodiment, a wide frequency range oscillator having automatic digital amplitude control may comprise: an oscillator/amplifier adapted for coupling to a frequency determining element, wherein the frequency determining element determines an oscillation frequency thereof; a peak amplitude detector coupled to the oscillator-amplifier, wherein the peak amplitude detector provides a direct current (DC) voltage proportional to an amplitude of an oscillation signal from the oscillator/amplifier; a voltage reference generator for providing a reference voltage; a voltage comparator for comparing the DC voltage from the peak amplitude detector to the reference voltage, wherein the voltage comparator is at a first logic level when the DC voltage from the peak amplitude detector may be less than the reference voltage and may be at a second logic level when the DC voltage from the peak amplitude detector may be greater than the reference voltage; an up/down counter having a clock input and a up/down count control input coupled to the voltage comparator, wherein when the up/down count control input may be at the first logic level the up/down counter increments up a count value, and when the count control input may be at the second logic level the up/down counter decrements down the count value; and a digital-to-analog converter (DAC) having inputs coupled to the up/down counter and an output coupled to the oscillator/amplifier; wherein amplification gain of the oscillator/amplifier may be determined by an analog current value from the output of the DAC which may be controlled by the count value from the up/down counter.

According to a further embodiment, the voltage reference generator may be programmable for selection of different reference voltages. According to a further embodiment, the voltage reference generator may comprise a bandgap voltage reference. According to a further embodiment, the voltage reference generator may comprise a zener diode voltage reference. According to a further embodiment, a start-up register and a power-on-reset (POR) detector may be coupled to the up/down counter, wherein when a start-up may occur the up/down counter may be loaded with a start-up count value from the start-up register. According to a further embodiment, the frequency determining element may comprise a crystal. According to a further embodiment, the frequency determining element may be selected from the group consisting of a piezoelectric resonator, an inductor-capacitor tuned circuit, and a resistor-capacitor network. According to a further embodiment, the oscillator-amplifier may use a current mirror transistor coupled to the DAC for controlling the gain of a companion transistor in an amplification circuit of the oscillator/amplifier. According to a further embodiment, the first logic level may be a logic high and the second logic level may be a logic low. According to a further embodiment, the first logic level may be a logic low and the second logic level may be a logic high. According to a further embodiment, the oscillator/amplifier, peak amplitude detector, voltage reference generator, voltage comparator, up/down counter, and DAC may be provided in a microcontroller. According to a further embodiment, the frequency determining element may be provided in the microcontroller.

According to another embodiment, a wide frequency range oscillator having automatic digital amplitude control may comprise: an oscillator/programmable gain amplifier (PGA) adapted for coupling to a frequency determining element, wherein the frequency determining element determines an oscillation frequency thereof; a peak amplitude detector coupled to the oscillator/PGA, wherein the peak amplitude detector provides a direct current (DC) voltage proportional to an amplitude of an oscillation signal from the oscillator/PGA; a voltage reference generator for providing a reference voltage; a voltage comparator for comparing the DC voltage from the peak amplitude detector to the reference voltage, wherein the voltage comparator may be at a first logic level when the DC voltage from the peak amplitude detector may be less than the reference voltage and may be at a second logic level when the DC voltage from the peak amplitude detector may be greater than the reference voltage; and an up/down counter having a clock input and a up/down count control input coupled to the voltage comparator, wherein when the up/down count control input may be at the first logic level the up/down counter increments up a count value, and when the count control input may be at the second logic level the up/down counter decrements down the count value; wherein the up/down counter may be coupled to the oscillator/PGA and amplification gain thereof may be controlled by the count value from the up/down counter.

According to a further embodiment, the voltage reference generator may be programmable for selection of different reference voltages. According to a further embodiment, the voltage reference generator may comprise a bandgap voltage reference. According to a further embodiment, the voltage reference generator may comprise a zener diode voltage reference. According to a further embodiment, a start-up register and a power-on-reset (POR) detector may be coupled to the up/down counter, wherein when a start-up may occur the up/down counter may be loaded with a start-up count value from the start-up register. According to a further embodiment, the frequency determining element comprises a crystal. According to a further embodiment, the frequency determining element may be selected from the group consisting of a piezoelectric resonator, an inductor-capacitor tuned circuit, and a resistor-capacitor network. According to a further embodiment, the first logic level may be a logic high and the second logic level may be a logic low. According to a further embodiment, the first logic level may be a logic low and the second logic level may be a logic high. According to a further embodiment, the oscillator/PGA, peak amplitude detector, voltage reference generator, voltage comparator, and up/down counter may be provided in a microcontroller. According to a further embodiment, the frequency determining element may be provided in the microcontroller.

According to yet another embodiment, a method for digitally controlling an amplitude of a wide frequency range oscillator may comprise the steps of: generating an alternating current (AC) signal having an amplitude with an oscillator/amplifier; converting the amplitude of the AC signal from the oscillator/amplifier to a direct current (DC) voltage value with a peak detector; generating a reference voltage with a voltage reference generator; comparing the DC voltage value to the reference voltage with a voltage comparator; incrementing up a count value in an up/down counter when the DC voltage value may be less than the reference voltage; decrementing down the count value in the up/down counter when the DC voltage value may be greater than the reference voltage; and controlling the amplitude of the AC signal with the count value.

According to a further embodiment of the method, the step of controlling the amplitude of the AC signal with the count value may comprise the steps of: converting the count value to an analog current value with a digital-to-analog converter (DAC); and controlling a gain of a current-mirror amplifier circuit in the oscillator/amplifier with the analog current value. According to a further embodiment of the method, the step of controlling the amplitude of the AC signal with the count value may comprise the step of controlling a programmable gain amplifier (PGA) circuit in the oscillator/amplifier with the count value. According to a further embodiment of the method, the step of selecting the DC voltage value from a plurality of different DC voltage values may comprise selecting the DC voltage value with a programmable voltage reference generator. According to a further embodiment of the method, the step of using a predefined count value may be performed upon start-up of said oscillator.

BRIEF DESCRIPTION OF THE DRAWINGS

A more complete understanding of the present disclosure may be acquired by referring to the following description taken in conjunction with the accompanying drawings wherein.

Figure 1:
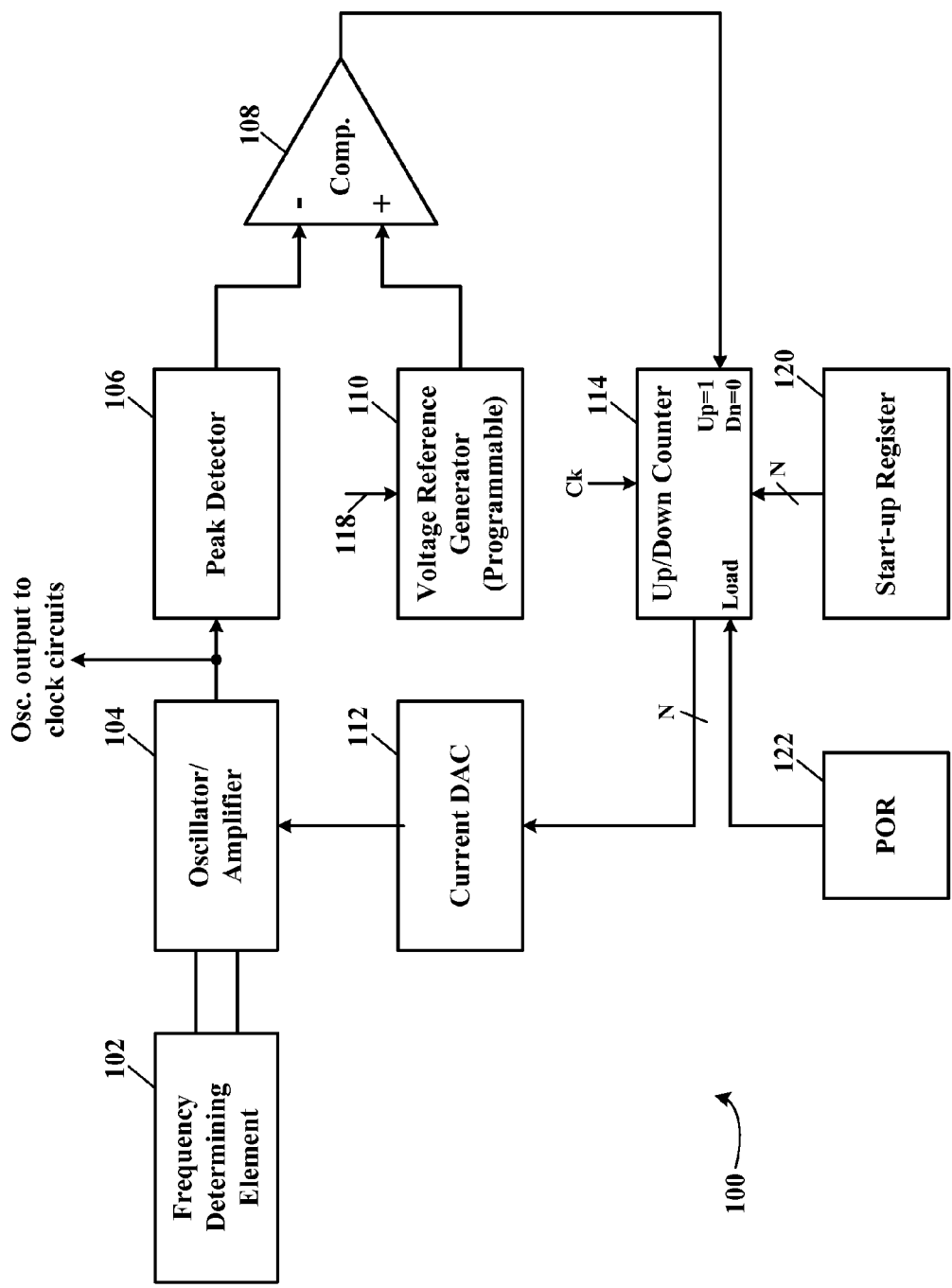
FIG. 1 illustrates a schematic block diagram of a constant output amplitude oscillator, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

An oscillator/amplifier circuit is designed to properly operate at a worst case highest frequency of operation then that oscillator circuit has the gain of its amplifier controlled so that the output amplitude of the oscillator/amplifier does not exceed a desired amplitude value for all possible frequencies of operation. A digital control loop in the oscillator/amplifier gain circuit controls the amplitude of the oscillation waveform over the entire possible frequency range of operation. The digital control loop does not create a stability problem as analog control loops have a tendency to do, it is resistant to noise, smaller in area than an equivalent analog control loop, is easy to implement and is scalable for higher oscillator frequency designs.

Automatic gain adjustment of the oscillator/amplifier provides for a faster start-up time of the oscillation and thereafter maintains the oscillation waveform amplitude to a desired value, e.g., two volts. The oscillator frequency range is only limited by the gain of the oscillator/amplifier at the oscillation frequency of interest. It is contemplated and within the scope of this disclosure, but is not limited to, from about 4 MHz to about 32 MHz, and may be easily extended to even higher frequencies, e.g., 40 MHz, by increasing the number of bits in the digital control loop. However, absolute tight control of the oscillation waveform amplitude may not be necessary so long as the amplitude does not exceed the power supply voltage rails, e.g., $V_{DD}$ and/or $V_{SS}$, of the integrated circuit device and is of adequate amplitude to properly drive the clock circuits of the integrated circuit device.

The digital control loop comprises a peak detector for measuring the oscillator output amplitude and providing a DC voltage proportional thereto, a voltage reference for establishing a desired output amplitude, a voltage comparator which compares the DC voltage from the peak detector to the reference voltage from the voltage reference generator, an up/down counter whose count direction is controlled by the output from the voltage comparator, and a digital control circuit for controlling the gain of the oscillator/amplifier. Wherein the larger the count value, the higher the gain of the oscillator/amplifier, and visa-versa. The up/down counter and digital control circuit may be configured to have enough bits of resolution to control the gain of the oscillator/amplifier over the entire possible range of frequency operation thereof.

However, fine granularity of the amplifier gain (tight amplitude control) may not be needed since a digital clock circuit has a fairly wide margin of input voltages for proper operation. So long as the oscillator output amplitude is maintained below the points of clipping, distortion, and causing substrate noise due to electrostatic discharge (ESD) device clamping into the substrate of the integrated circuit device, a certain amplitude variation may be acceptable. Thus, the number of bits resolution required in the digital control loop may be determined by the range of gains of the amplifier over the entire operating range of oscillator frequencies of interest. E.g., a wide range of gains versus frequency will require more bits of resolution in the digital control loop to maintain a desired oscillation waveform amplitude over the entire operating frequency range of the oscillator.

The voltage reference generator, optionally, may be programmable so that the reference voltage may be set to an appropriate value, thereby adjusting the oscillator output amplitude to be compatible with different logic types, e.g., 5 volt, 3 volt, 1.2 volt, etc. A start-up register, optionally, may also be used to preset a count value in the up/down counter for faster oscillation start-up response, and/or minimize amplitude overshoot from excessive gain of the amplifier when being used at lower frequencies of operation. Normally the digital loop control will automatically adjust start-up gain sufficient to sustain oscillation at a desired output amplitude but it may take a short time to do so, e.g., a few hundred microseconds, depending upon the up/down counter clock speed. By presetting the count value in the up/down counter this time may be shortened during start-up of the oscillator.

Referring now to the drawings, the details of specific example embodiments are schematically illustrated. Like elements in the drawings will be represented by like numbers, and similar elements will be represented by like numbers with a different lower case letter suffix.

Referring to FIG. 1, depicted is a schematic block diagram of a constant output amplitude oscillator, according to a specific example embodiment of this disclosure. The constant output amplitude oscillator, generally represented by the numeral 100, may comprise a frequency determining element 102, a gain controllable oscillator/amplifier 104, a amplitude peak detector 106, a voltage reference generator 110, a voltage comparator 108, an up/down counter 114 and a digital-to-analog converter (DAC) 112 having a current output. The amplitude peak detector 106 detects and converts the radio frequency (RF) alternating current (AC) waveform from the output of the oscillator/amplifier 104 to a direct current (DC) voltage having a DC value proportional to the amplitude of the RF oscillator output signal therefrom. This DC voltage representative of the amplitude of the RF oscillator output signal may be coupled to a negative input of the voltage comparator 108. The voltage reference generator 110 may provide a DC reference voltage to a positive input of the voltage comparator 108. When the DC voltage at the negative input of the voltage comparator 108 is greater than the DC voltage at the positive input of the voltage comparator 108, the output of the voltage comparator 108 is at a logic low or logic "0." When the DC voltage at the negative input of the voltage comparator 108 is less than or equal to the DC voltage at the positive input of the voltage comparator 108, the output of the voltage comparator 108 is at a logic high or logic "1." The voltage reference generator 110 may be, for example but is not limited to, a bandgap voltage reference, a zener diode, etc.

The output from the voltage comparator 108 may be coupled to a count control input of the up/down counter 114. Wherein when the count control input is at a logic "1" the counter 114 will count up for each clock pulse received at the clock input thereof. And when the count control input is at a logic "0" the counter 114 will count down for each clock pulse received at the clock input thereof. The count value of the up/down counter 114 may be coupled to digital inputs of the DAC 112 which changes these digital count values to an analog current output proportional to the present digital count value at the input of the DAC 112. The oscillator/amplifier 104 may comprise an amplifier circuit having a current mirror where the amount of current in a current mirror transistor will determine the gain of a companion transistor used in the amplification circuit of the oscillator/amplifier 104. Therefore, the gain of the oscillator/amplifier 104 may be controlled by the current value from the DAC 112.

When the output from the comparator 108 is at a logic "1" the up/down counter 114 counts up thereby increasing the analog current value from the DAC 112 to the mirror transistor in the amplification circuit of the oscillator/amplifier 104. This logic "1" state of the comparator 108 indicates that the RF output amplitude from the oscillator/amplifier 104 is less than a desired amplitude value represented by the value of the DC voltage from the voltage reference generator 110. Wherein as the current value from the DAC 112 increases so does the gain of the amplifier circuit in the oscillator/amplifier 104 until the DC voltage from the peak detector 106 is equal to or greater than the DC voltage from the voltage reference generator 110. Wherein the output of the comparator 108 goes to a logic "0" and the up/down counter 114 starts counting down instead of up. As the count value from the up/down counter 114 decreases so does the current output from the DAC 112 and the gain of the amplifier circuit decreases in the oscillator/amplifier 104. At a steady state equilibrium condition, the gain of the amplifier circuit may will fluctuate between about one count above and about one count below the equivalent DC voltage from the voltage reference generator 110. Thus the oscillator RF output will stabilize and remain at a desired amplitude value for any frequency at which the oscillator 100 may be used, e.g., high, low or in-between. This digital control loop also effectively corrects for temperature, voltage and process variations that may affect the gain of the amplifier circuit in the oscillator/amplifier 104.

The digital control loop disclosed herein is designed for faster startup of oscillations in the oscillator/amplifier 104. The oscillation amplitude of the oscillator/amplifier 104 may start from a very small amplitude and increases slowly. The time it takes for the oscillation amplitude to grow depends upon the initial gain of the amplifier circuit of the oscillator/amplifier 104. The digital control loop described herein provides for the gain of the amplifier circuit to be higher during startup of the oscillation and subsequently reduces the gain later when the oscillation amplitude exceeds the desired value, e.g., the reference voltage value from the voltage reference 110.

For example, When the oscillation amplitude begins to build up the oscillator/amplifier peak output voltage (amplitude) is less than the reference voltage value so the output from the comparator 108 remains at a logic "1" and the up/down counter 114 continues to count up at each clock pulse. This up counting causes the current output from the DAC 112 to increase which increases the gain of the oscillator/amplifier circuit. It may take a few hundred micro-seconds to build up the oscillation amplitude starting with a DC voltage of around a metal oxide semiconductor (MOS) threshold voltage. Since the reference voltage may be approximately twice the MOS threshold voltage, the peak amplitude from the oscillator/amplifier 104 will be less than the reference voltage during this startup time.

During this startup time, the output from the comparator 108 will remain at a logic "1" and the up/down counter 114 continues to count up. The DAC 112 output current continues to increase wherein the gain of the amplifier circuit in the oscillator/amplifier 104 increases. Therefore the digital control loop will program a lot of amplifier gain during the startup phase of the oscillator/amplifier 104. Then during the course of the oscillation output amplitude increasing a point will be reached where the DC voltage output from the peak detector 106 will overshoot (exceed) the reference voltage value from the voltage reference 110. At which time the output of the comparator 108 goes to a logic "0" and the up/down counter 114 will then start counting down instead of up. This change in count direction of the up/down counter 114 reduces the gain of the amplifier circuit in the oscillator/amplifier and a quiescent state will then prevail. Thus, advantageously, the oscillator/amplifier 104 will have higher gain during startup which reduces the startup time required by the oscillator/amplifier 104.

It is contemplated and with the scope of this disclosure that the selection of the number of counter bits of the up/down counter 114 and the digital input bits of the current DAC 112 will be sufficient to control the amplification range of the amplifier circuit in the oscillator/amplifier 104 over the intended operating frequency range. One having ordinary skills in the art of analog amplifier design and digital electronics, and the benefit of this disclosure could readily design appropriate circuits to accomplish the desired end result.

Optionally, a start-register 120 and a power-on-reset 122 may be used to preload a count value into the up/down counter 114 during a power-on event, so as to preset the gain of the amplifier circuit in the oscillator/amplifier 104. This may reduce the start-up time required by the oscillator/amplifier 104. Also presetting the gain of the amplifier circuit to less than a maximum gain value may reduce start-up EMI generation when the oscillator 100 is operating at a lower frequency where the gain of the amplifier circuit may be very high. The voltage reference generator 110 may optionally be programmable so that the reference voltage therefrom may be adjusted to produce oscillator amplitudes that will match different input clock signal requirements of different logic types and/or operating voltages.

Figure 2:
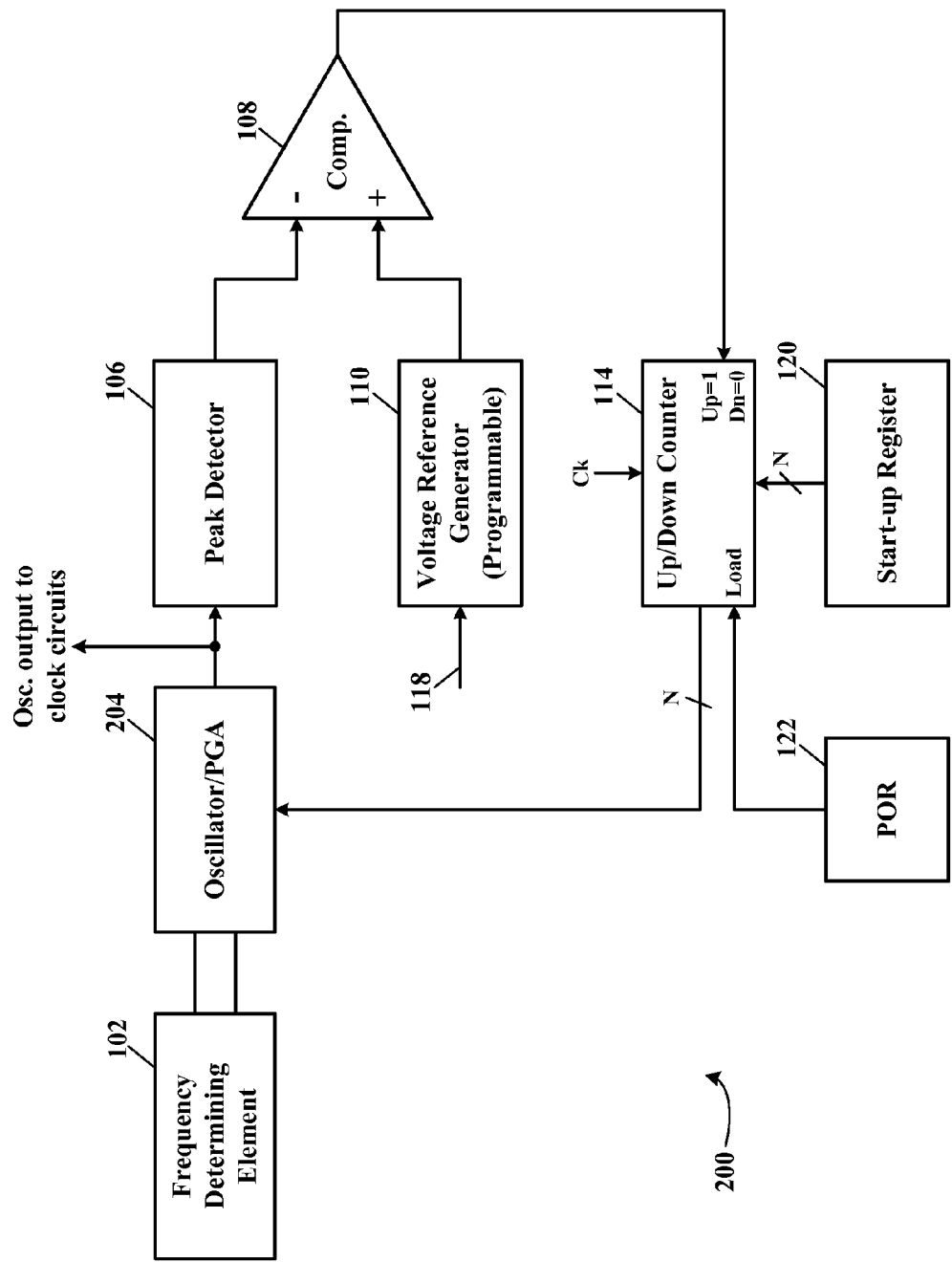
FIG. 2 illustrates a schematic block diagram of a constant output amplitude oscillator, according to another specific example embodiment of this disclosure.

Referring to FIG. 2, depicted is a schematic block diagram of a constant output amplitude oscillator, according to another specific example embodiment of this disclosure. The circuit shown in FIG. 2 operates in a similar fashion to the circuit of FIG. 1 described hereinabove with the differences being in not requiring a current DAC 112 because the amplifier circuit of the oscillator/PGA 204 (programmable gain amplifier) may directly utilize the digital outputs from the up/down counter 114. The PGA 204 has internal circuitry that digitally controls the amount of amplification, thereby directly digitally controlling the oscillation RF amplitude as described more fully hereinabove. Representative PGAs are more fully described in commonly owned U.S. Pat. No. 6,847,904 B2; entitled "Multi-Channel Programmable Gain Amplifier Controlled with a serial Interface" by Kumen Blake, et al.; and U.S. Pat. No. 6,462,621 B1; entitled "Operational Amplifier that is Configurable as a Programmable Gain Amplifier of a General Purpose Amplifier" by Michael Charles, et al.; both of which are hereby incorporated by reference herein for all purposes.

Figure 3:
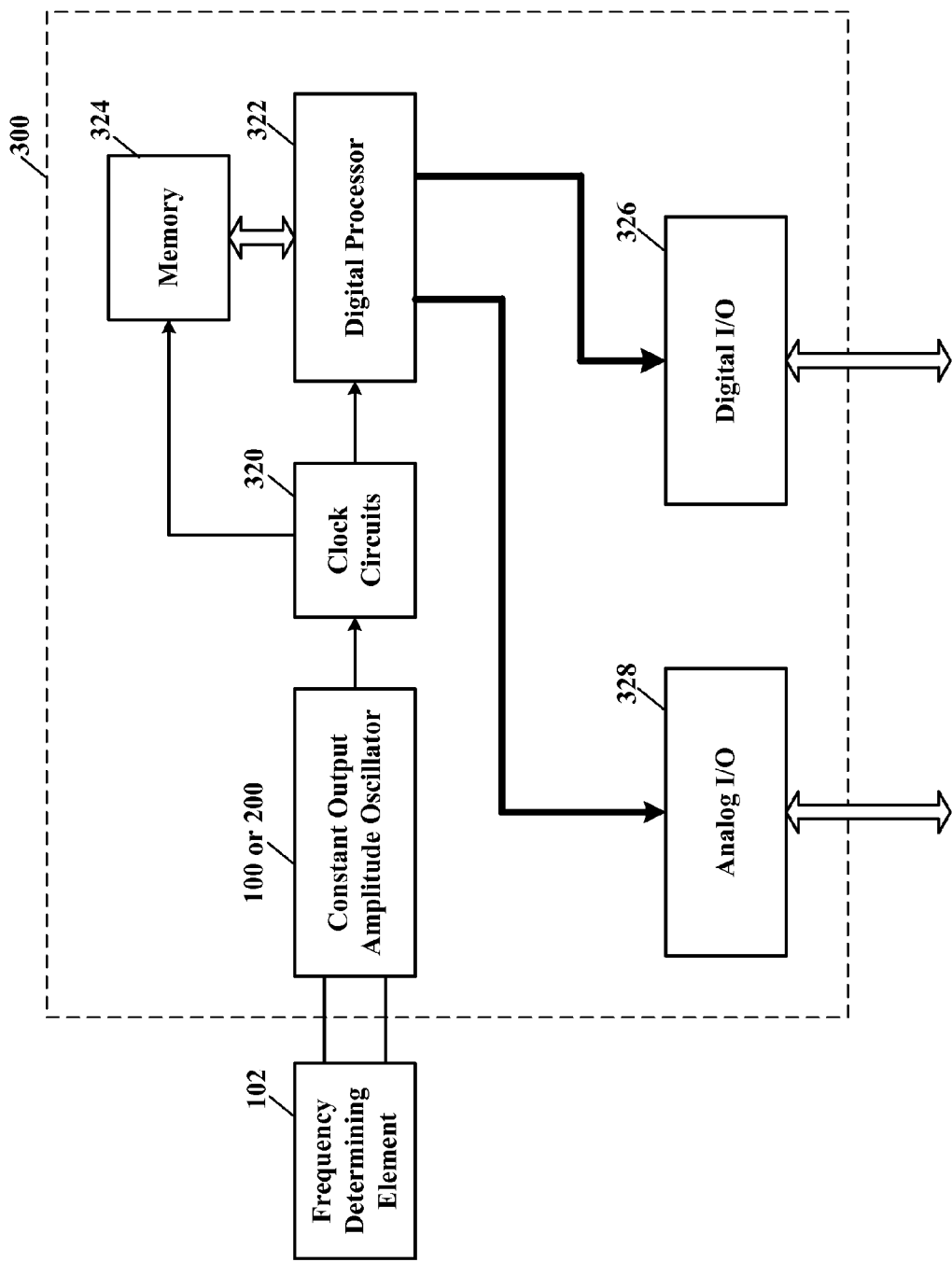
FIG. 3 illustrates a schematic block diagram of an integrated circuit device using the constant output amplitude oscillator shown in FIG. 1 or 2, according to the teachings of this disclosure.

Referring to FIG. 3, depicted is a schematic block diagram of an integrated circuit device using the constant output amplitude oscillator shown in FIG. 1 or 2, according to the teachings of this disclosure. A semiconductor device, generally represented by the numeral 300, may comprise the constant output amplitude oscillator 100 or 200 described more fully hereinabove, clock circuits 320, a digital processor 322, a memory 324 coupled to the digital processor 322, digital I/O 326 and optionally analog I/O 328. The semiconductor device 300 may be, for example but is not limited to, a microcontroller, an application specific integrated circuit (ASIC), a programmable logic array (PLA), etc. The semiconductor device 300 in combination with the new, novel and non-obvious constant output amplitude oscillator 100 or 200, may be utilized for a broad range of applications requiring from only a low frequency oscillator to a very high frequency oscillator for the internal clock circuits. This wide range of frequency operation does not result in undesired excessive radiate EMI problems when operated at lower oscillator frequencies. It is contemplated and within the scope of this disclosure that the frequency determining element 102 or part thereof may be internal to the semiconductor device 300 instead of external thereto.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A wide frequency range oscillator having automatic digital amplitude control, comprising:
    an oscillator/amplifier adapted for coupling to a frequency determining element, wherein the frequency determining element is selected from the group consisting of a crystal, a piezoelectric resonator, an inductor-capacitor tuned circuit, and a resistor-capacitor network which determines an oscillation frequency of the oscillator amplifier;
    a peak amplitude detector coupled to the oscillator-amplifier, wherein the peak amplitude detector provides a direct current (DC) voltage proportional to an amplitude of an oscillation signal from the oscillator/amplifier;
    a voltage reference generator for providing a reference voltage;
    a voltage comparator for comparing the DC voltage from the peak amplitude detector to the reference voltage, wherein the voltage comparator is at a first logic level when the DC voltage from the peak amplitude detector is less than the reference voltage and is at a second logic level when the DC voltage from the peak amplitude detector is greater than the reference voltage;

an up/down counter having a clock input and a up/down count control input coupled to the voltage comparator, wherein when the up/down count control input is at the first logic level the up/down counter increments up a count value, and when the count control input is at the second logic level the up/down counter decrements down the count value;

a digital-to-analog converter (DAC) having inputs coupled to the up/down counter and an output coupled to the oscillator/amplifier; and a start-up register and a power-on-reset (POR) detector coupled to the up/down counter, wherein when a start-up occurs the up/down counter is loaded with a start-up count value from the start-up register, wherein amplification gain of the oscillator/amplifier is determined by an analog current value from the output of the DAC which is controlled by the count value from the up/down counter.

2. The wide frequency range oscillator according to claim 1, wherein the voltage reference generator is programmable for selection of different reference voltages.

3. The wide frequency range oscillator according to claim 1, wherein the voltage reference generator comprises a bandgap voltage reference.

4. The wide frequency range oscillator according to claim 1, wherein the voltage reference generator comprises a zener diode voltage reference.

5. The wide frequency range oscillator according to claim 1, wherein the frequency determining element comprises a crystal.

6. The wide frequency range oscillator according to claim 1, wherein the oscillator-amplifier uses a current mirror transistor coupled to the DAC for controlling the gain of a companion transistor in an amplification circuit of the oscillator/amplifier.

7. The wide frequency range oscillator according to claim 1, wherein the first logic level is a logic high and the second logic level is a logic low.

8. The wide frequency range oscillator according to claim 1, wherein the first logic level is a logic low and the second logic level is a logic high.

9. The wide frequency range oscillator according to claim 1, wherein the oscillator/amplifier, peak amplitude detector, voltage reference generator, voltage comparator, up/down counter, and DAC are provided in a microcontroller.

10. The wide frequency range oscillator according to claim 9, further comprising the frequency determining element being provided in the microcontroller.

11. A wide frequency range oscillator having automatic digital amplitude control, comprising:

an oscillator/programmable gain amplifier (PGA) adapted for coupling to a frequency determining element, wherein the frequency determining element is selected from the group consisting of a crystal, a piezoelectric resonator, an inductor-capacitor tuned circuit, and a resistor-capacitor network which determines an oscillation frequency of the oscillator/programmable gain amplifier;

a peak amplitude detector coupled to the oscillator/PGA, wherein the peak amplitude detector provides a direct current (DC) voltage proportional to an amplitude of an oscillation signal from the oscillator/PGA;

a voltage reference generator for providing a reference voltage;

a voltage comparator for comparing the DC voltage from the peak amplitude detector to the reference voltage, wherein the voltage comparator is at a first logic level when the DC voltage from the peak amplitude detector is less than the reference voltage and is at a second logic level when the DC voltage from the peak amplitude detector is greater than the reference voltage;

an up/down counter having a clock input and a up/down count control input coupled to the voltage comparator, wherein when the up/down count control input is at the first logic level the up/down counter increments up a count value, and when the count control input is at the second logic level the up/down counter decrements down the count value; and a start-up register and a power-on-reset (POR) detector coupled to the up/down counter, wherein when a start-up occurs the up/down counter is loaded with a start-up count value from the start-up register, wherein the up/down counter is coupled to the oscillator/PGA and amplification gain thereof is controlled by the count value from the up/down counter.

12. The wide frequency range oscillator according to claim 11, wherein the voltage reference generator is programmable for selection of different reference voltages.

13. The wide frequency range oscillator according to claim 11, wherein the voltage reference generator comprises a bandgap voltage reference.

14. The wide frequency range oscillator according to claim 11, wherein the voltage reference generator comprises a zener diode voltage reference.

15. The wide frequency range oscillator according to claim 11, wherein the frequency determining element comprises a crystal.

16. The wide frequency range oscillator according to claim 11, wherein the first logic level is a logic high and the second logic level is a logic low.

17. The wide frequency range oscillator according to claim 11, wherein the first logic level is a logic low and the second logic level is a logic high.

18. The wide frequency range oscillator according to claim 11, wherein the oscillator/PGA, peak amplitude detector, voltage reference generator, voltage comparator, and up/down counter are provided in a microcontroller.

19. The wide frequency range oscillator according to claim 18, further comprising the frequency determining element being provided in the microcontroller.

20. A method for digitally controlling an amplitude of a wide frequency range oscillator, said method comprising the steps of:

generating an alternating current (AC) signal having an amplitude with an oscillator/amplifier coupled with a frequency determining element, wherein the frequency determining element is selected from the group consisting of a crystal, a piezoelectric resonator, an inductor-capacitor tuned circuit, and a resistor-capacitor network;

converting the amplitude of the AC signal from the oscillator/amplifier to a direct current (DC) voltage value with a peak detector;

generating a reference voltage with a voltage reference generator;

comparing the DC voltage value to the reference voltage with a voltage comparator;

incrementing up a count value in an up/down counter when the DC voltage value is less than the reference voltage;

decrementing down the count value in the up/down counter when the DC voltage value is greater than the reference voltage; and controlling the amplitude of the AC signal with the count value, wherein the count value is set to a predetermined start-up value upon detection of a power-on-reset (POR), wherein the start-up value is greater than 0.

21. The method according to claim 20, wherein the step of controlling the amplitude of the AC signal with the count value comprises the steps of:
converting the count value to an analog current value with a digital-to-analog converter (DAC); and
controlling a gain of a current-mirror amplifier circuit in the oscillator/amplifier with the analog current value.

22. The method according to claim 20, wherein the step of controlling the amplitude of the AC signal with the count value comprises the step of controlling a programmable gain amplifier (PGA) circuit in the oscillator/amplifier with the count value.

23. The method according to claim 20, further comprising the step of selecting the DC voltage value from a plurality of different DC voltage values with a programmable voltage reference generator.

* * * * *